United States Patent [19]

Benbow

[11] Patent Number: 4,491,789
[45] Date of Patent: Jan. 1, 1985

[54] ELECTRICAL ENERGY METER HAVING A COVER-MOUNTED TIME-OF-DAY MULTIFUNCTION REGISTER

[75] Inventor: Eugene C. Benbow, Raleigh, N.C.

[73] Assignee: Westinghouse Electric Corp., Pittsburgh, Pa.

[21] Appl. No.: 292,978

[22] Filed: Aug. 14, 1981

[51] Int. Cl.³ ............................................. G01R 13/04
[52] U.S. Cl. .................... 324/113; 324/156; 324/157
[58] Field of Search ................ 324/113, 156, 157, 96; 346/14 MR; 340/531, 538

[56] References Cited

U.S. PATENT DOCUMENTS 4,082,999  4/1978  Staker ................................ 324/156
4,121,147  10/1978  Becker et al. ...................... 324/157
4,298,839  11/1981  Johnston ............................. 324/96

FOREIGN PATENT DOCUMENTS 1330076  9/1973  United Kingdom .

Primary Examiner—Stewart J. Levy
Attorney, Agent, or Firm—D. R. Lackey

[57] ABSTRACT

An electrical energy meter for measuring various parameters of electrical energy consumption has a cover-mounted time-of-day multifunction register. Digital signals representative of electrical energy usage are input to the time-of-day multifunction register which measures energy consumption during the on-peak, off-peak, and intermediate-peak periods of each day. The multifunction register communicates by way of light radiations with an external programmer/reader unit having a plurality of fingers at its front face. These fingers engage recesses in the meter cover for accurate alignment of the multifunction register and the programmer/reader unit. Attaching the multifunction register to the meter cover rather than to the meter frame offers improved alignment between the multifunction register and the programmer/reader unit and provides easy retrofitting of present watthour meters lacking the time-of-day feature with a time-of-day multifunction register. Also, shielding the time-of-day multifunction register from the heat-generating components of the watthour meter allows the time-of-day multifunction register and associated components to operate at a lower ambient temperature.

6 Claims, 4 Drawing Figures

ELECTRICAL ENERGY METER HAVING A COVER-MOUNTED TIME-OF-DAY MULTIFUNCTION REGISTER

BACKGROUND OF THE INVENTION

1. Field of the Invention

This invention relates generally to electric energy meters with time-of-day multifunction registers, and more specifically, to the placement of the multifunction register within the meter assembly.

2. Description of the Prior Art

Due to recent escalating costs of generating electrical energy, utility companies and manufacturers of electrical energy metering systems have developed devices to provide for more efficient use of electrical generation facilities during both on-peak and off-peak load periods. One such device, the time-of-day (TOD) meter, measures electrical energy consumption during several time intervals of each day. In this way, a different billing rate can be applied for the electrical energy consumed during each time interval. In the absence of such a multiple rate pricing structure, the low demand usage customer billed at the same rate as the high demand usage customer in effect subsidizes the high demand user. From a customer's standpoint, differential pricing is therefore more equitable. From the utility's standpoint, a multiple rate pricing structure encourages consumers of electrical energy to shift consumption from on-peak periods to off-peak periods, thus increasing the overall power distribution system efficiency and reducing the capital expenditures otherwise required for extra power generating equipment during on-peak periods.

Some meters of the TOD type utilize an induction watthour meter movement with multi-dial registers and gear trains, and mechanical means for selectively engaging separate register dials under the control of a mechanical clock mechanism. The recent application of solid-state electronic devices to TOD meters has eliminated the mechanical registers and gear trains, permitting an increase in the number of electrical energy parameters that can be measured. This has resulted in greater flexibility to the utility regarding the number and application of rate selection schedules. One such solid-state TOD meter is disclosed in U.S. Pat. No. 4,283,772 which is assigned to the assignee of the present invention. This patent discloses a programmable time registering AC electric energy meter including solid-state logic circuitry with a programmed sequence of operation. The solid-state logic circuitry is referred to as a time-of-day (TOD) multifunction register. Within the TOD multifunction register a first read-write memory device stores energy consumption data (i.e., kilowatt hours and kilowatt demand) in different accumulators dependent upon whether the energy is consumed during an on-peak, off-peak, or intermediate-peak load period. A second read-write memory device stores fixed control point data indicating the on-peak, off-peak, and intermediate-peak periods of each day. Data in the second read-write memory is stored with a minutes, hours, days of the week, and day of the year format. A control unit compares the current real time with the contents of the second read-write memory and controls the first read-write memory such that it accumulates energy consumption data in the on-peak accumulator during on-peak periods, in the intermediate peak accumulator during intermediate peak periods, and in the off-peak accumulator during off-peak intervals. These three load periods correspond, respectively, to the high, mid, and base billing rate categories. The time and date data and each of the time related parameters of kilowatt hours and kilowatt demand are sequentially applied to an optoelectronic readout display of the meter. The optoelectronic display of this meter sequentially shows time in hours and minutes, the day of the week, and the day of the year. It also displays the following accumulated electric energy consumption parameters: total kilowatt hours; kilowatt hours for the high rate, mid-rate, and base rate; and kilowatt demand for the high rate, mid-rate, and base rate.

An optical data link tube, connected to the TOD multifunction register is disclosed in U.S. Pat. No. 4,298,839 which is assigned to the assignee of the present invention. The optical data link tube communicates with an external programmer/reader unit via a plurality of opto-electronic devices to initialize, reprogram, and read the time and consumption data stored in the various read-write memory devices of the TOD multifunction register. The programmer/reader unit is also utilized to perform various data verification and synchronization functions. Further information regarding the programmer/reader unit can be found in U.S. Pat. No. 4,291,375 which is assigned to the assignee of the present invention.

In the aforementioned U.S. Pat. No. 4,298,839 the optical data link tube is mounted on the printed circuit boards carrying the time-of day multifunction register. These printed circuit boards are supported by the meter frame; the meter frame and cover are mounted to the meter base. Proper alignment between the programmer/reader probe and the optical data link tube is facilitated by three finger-like projections located in the front face of the probe. These projections engage three recesses in the meter cover to align the probe with the optical data link tube. Because the optical data link tube is ultimately attached to the meter base and the recesses for aligning the probe with the tube are in the meter cover, any misalignment between the meter cover and the meter base will cause misalignment between the probe and the optical data link tube. Obviously, such misalignment degrades communication between the probe and the optical data link tube. The tolerance build-up associated with attaching the TOD multifunction register circuit boards to the frame and the optical data link tube to the circuit boards also adversely affects alignment between the optical data link tube and the programmer/reader probe. Mounting the TOD multifunction register circuit boards on the inside front face of the meter cover, as disclosed by the present invention, will decrease the tolerance buildup and completely eliminate the detrimental effect on the probe/tube alignment of angular misalignment between the meter cover and base.

Canadian Pat. No. 1,330,076 issued to Landis and Gyr AG discloses a light-emitting device arranged behind the transparent portion of a watthour meter cover. The light-emitting device is embedded in a holding magnet attached to the meter cover. Alignment with an external light-receiving device is facilitated by attraction between the holding magnet and a second magnet located within the light-receiving device. This prior art patent does not disclose recesses in the meter cover or fingerlike projections in the external light-receiving device for aligning the light receiver with the light emitter. Nor does it disclose attaching the light-emitting device to the meter cover as does the present invention.

Heat generated in prior art TOD meters, especially from self-heating of the electromagnet and the ambient temperature, has a deleterious effect on the printed circuit boards and electronic components of the TOD multifunction register. To overcome this problem it is common to paint the meter cover white on the outside. In the present invention the TOD multifunction register is shielded from the other meter components thereby obviating painting the meter cover. This and other advantages of the present invention are discussed in detail below in the "Description of the Preferred Embodiment".

SUMMARY OF THE INVENTION

A meter for measuring consumption of AC electric energy, including a time-of-day (TOD) multifunction register for measuring consumption during various time intervals, is disclosed. Electric energy consumption data is optically transmitted to an external programmer/reader probe via an optical data link tube of the TOD multifunction register. The TOD mutifunction register and the optical data link tube are mounted on the interior front face of the meter cover. The programmer/reader probe is placed in contact with the meter cover such that index means in the meter cover and front end of the probe properly align the probe with the optical data link tube. When properly aligned, accurate data transfer between the optical tube and the programmer/reader probe is facilitated.

DESCRIPTION OF THE PREFERRED EMBODIMENTS

Figure 1:
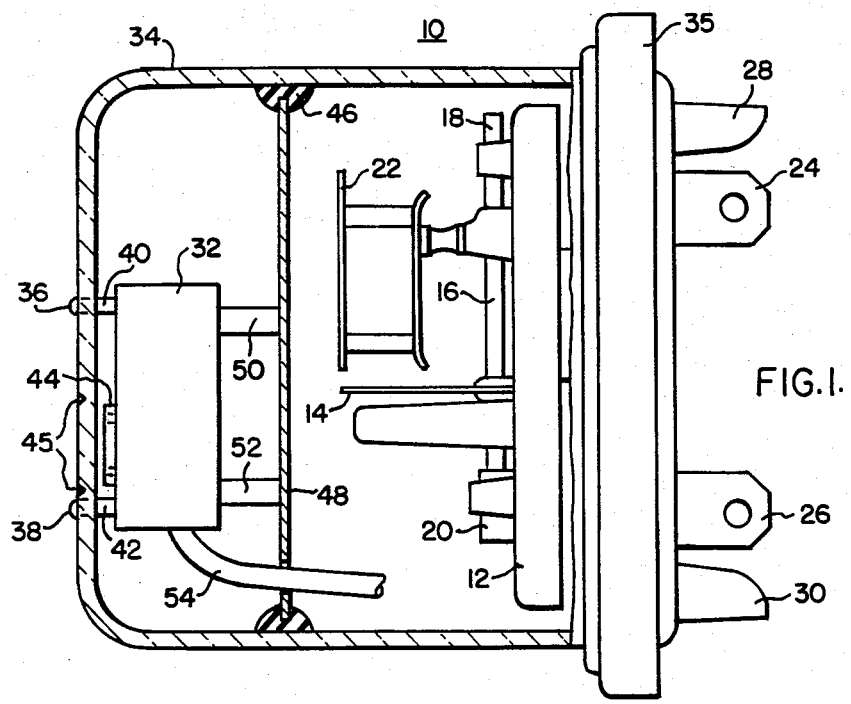
FIG. 1 is a side view partially in secion of an induction watthour meter including a time-of-day multifunction register mounted in accordance with the present invention.

Referring now to FIG. 1 there is shown an induction watthour meter 10, including a frame 12, made of a non-magnetic die-cast material such as aluminum, for supporting various parts of the watthour meter 10. The watthour meter 10 is generally of a type described in U.S. Pat. No. 3,309,152 issued Mar. 14, 1964 to Ramsey et al. which is incorporated herein by reference. Since the induction watthour meter will be only briefly described hereinafter, the reader desiring a more detailed description should refer to the aforementioned watthour meter patent.

AC electric energy is supplied to the watthour meter 10 via terminal blade pairs 24 and 26. Mounting lug pairs 28 and 30 attach the watthour meter 10 to a mounting cabinet (not shown). The AC electrical energy is directed to an electromagnet unit (not shown), described in the aforementioned U.S. Pat. No. 3,309,152. The electromagnet unit includes a voltage section having a voltage winding carried by an E-shaped laminated core and a current section including a pair of current coils carried by a C-shaped laminated core. The voltage and current sections direct AC driving magnetic fluxes across an air gap of the electromagnet unit and through a rotatable electroconductive disc 14. The disc 14 is carried on a vertical shaft 16. The shaft 16 is supported at its upper end by an upper bearing support 18 and at its lower end by a lower bearing support 20. The upper bearing support 18 and the lower bearing support 20 are carried by the frame 12 and are provided as disclosed in U.S. Pat. Nos. 3,143,704; 3,413,550; 3,693,086 and 3,810,683. The frame 12 is mounted on a base 35.

A driving torque is produced in the disc 14 by the interaction of eddy currents with the driving magnetic fluxes inducing the eddy currents. This phenomena is well understood in the art of watthour meters, including the watthour meter 10. A dial register 22, indicating the total quantity of AC electric energy consumed, is driven by the disc 14 through a series of gears (not shown).

Figure 2:
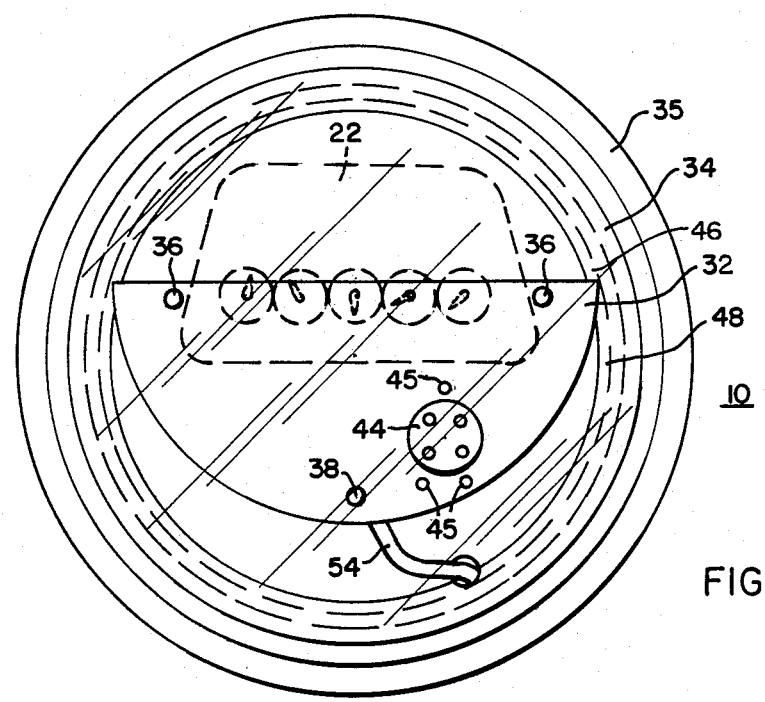
FIG. 2 is a front view of an induction watthour meter including a time-of-day multifunction register mounted in accordance with the present invention.

Referring to FIG. 1 for a side view and FIG. 2 for a front view, there is shown a time-of-day (TOD) multifunction register 32 attached to a meter cover 34 with a pair of round head-square neck bolts 36 and a round head-square neck bolt 38. (The components of FIG. 2 are similar to the components bearing identical reference characters in FIG. 1). As previously discussed, the TOD multifunction register 32 measures kilowatt hours and kilowatt demand during various time intervals of each day. A pair of spacer posts 40 is placed over the pair of bolts 36 to provide a clearance between the front of the time-of-day multifunction register 32 and the front inner surface of the meter cover 34. Similarly, a spacer post 42 is placed over the bolt 38. The meter cover 34 is attached to a meter base 35.

A short optical data link tube 44 communicates via light radiations with an external programmer/reader probe (not shown). The front face of the probe includes a plurality of fingers (not shown) for engagement with a plurality of recesses 45 in the meter cover 34. When the probe fingers are located in the recesses 45, the probe will be properly aligned with the optical data link tube 44. With the TOD multifunction register 32 mounted to the meter cover 34, angular misalignment between the meter cover 34 and the meter base 35 will not cause misalignment between the programmer/reader probe and the optical data link tube 44.

A circular rubber grommet 46 is attached to the interior circumference of the meter cover 34; a baffle plate 48 is inserted into the groove in the rubber grommet 46. A pair of spacer posts 50 and a spacer post 52 secures the rear side of the TOD multifunction register 32 to the baffle plate 48. A cable 54, for connecting the TOD multifunction register 32 with a pulse initiator (not shown) passes through a hole in the baffle plate 48. The pulse initiator is necessary to transform the analog signal generated by the disc 14 to digital pulses suitable for processing by the TOD multifunction register 32. Either a mechanical or electromechanical pulse initiator, both well known and understood in the meter art, can be used to perform this function. A third type of pulse initiator, a solid state pulse initiator, eliminates the disc 14 by producing pulses directly from the analog AC electrical signal. The TOD multifunction register 32 can also be utilized in conjunction with such a solid state pulse initiator.

With the TOD multifunction register 32 mounted to the meter cover 34 and separated from other components of the watthour meter 10 by the baffle plate 48, the watthour meter has improved heat dissipation characteristics. Therefore, it is unnecessary to paint the meter cover as done on prior art watthour meters having a time-of-day metering feature. Further, attaching the TOD multifunction register 32 to the meter cover 34 provides ease and flexibility in adding a time-of-day multifunction register to a presently installed meter without this feature.

Figure 3:
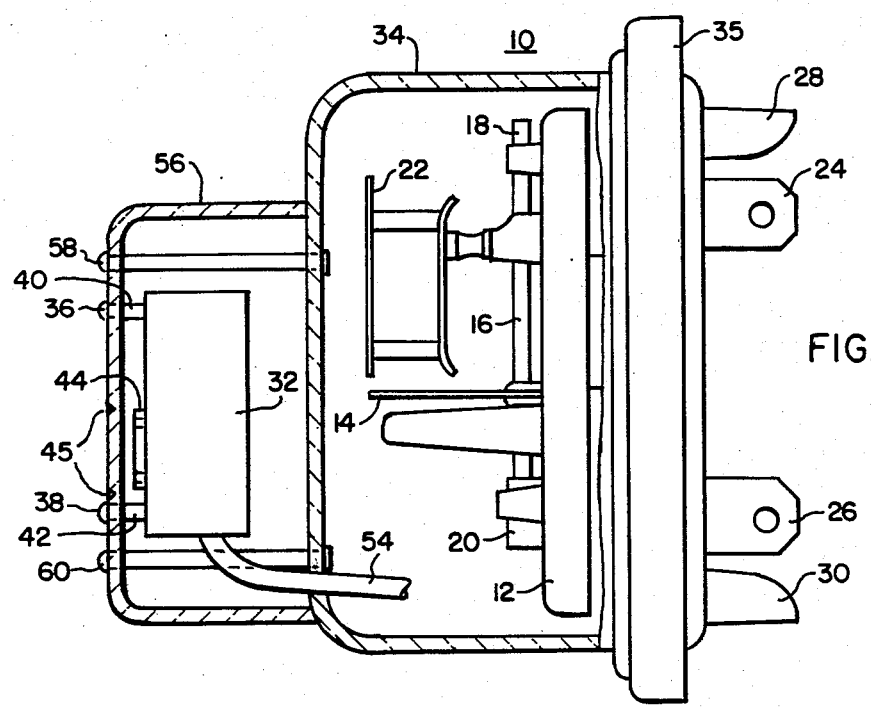
FIG. 3 is a side view partially in section of an induction watthour meter illustrating a second embodiment of the present invention.

FIG. 3 illustrates an alternative embodiment of the present invention. In this figure, the same reference numbers are used to designate those components having the same structure and function as discussed in regard to FIGS. 1 and 2. An extension cover 56 carrying the TOD multifunction register 32 is mounted to the meter cover 34 with round head-square neck stud pairs 58 and 60. Like the previously discussed embodiment, this mounting method improves alignment between the programmer/reader probe (not shown) and the optical data link tube 44, separates the TOD multifunction register 32 from the heat generating components of the watthour meter 10, and allows retrofitting present watthour meters lacking a time-of-day feature with the TOD multifunction register 32.

Figure 4:
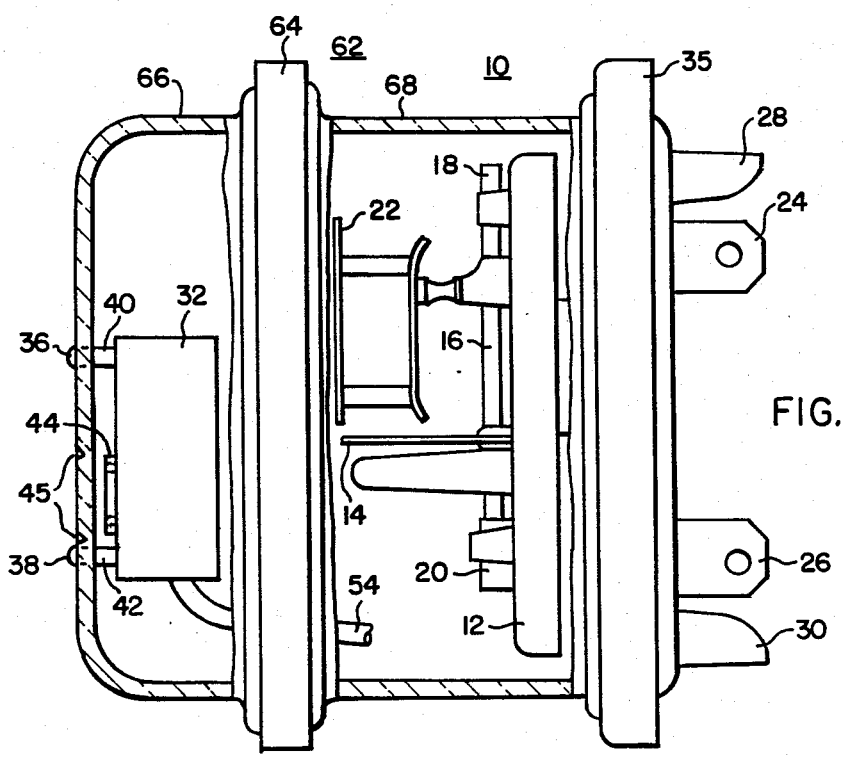
FIG. 4 is a side view partially in section of a watthour meter illustrating a third embodiment of the present invention.

A further embodiment of the present invention is shown in FIG. 4. Again, the same reference numbers are used to designate components having the same structure and function as shown in FIGS. 1 and 2. The watthour meter 10 of FIG. 4 has a bifurcated meter cover 62 consisting of a front section 66 and a rear section 68. The rear section 68 engages the meter base 35; the TOD multifunction register 32 is attached to the closed end of the front section 66. The rear section 68 is demountably attached to the front section 66 by a circular metal band 64. This configuration can be utilized for retrofitting present watthour meters with the time-of-day feature.

What is claimed is:

1. An electrical energy meter having a cover-mounted time-based multifunction register for measuring parameters of electrical energy usage, wherein said multifunction register includes an optical data link tube for interactively communicating by way of light radiations with a prgrammer/reader unit having a plurality of fingers at the front thereof, said electrical energy meter comprising:
    a meter base;
    means for providing signals representative of electrical energy usage, said means carried by said meter base;
    a cable, said cable connecting said multifunction register with said providing means;
    a cup-shaped cover engaging said meter base at an open end of said cover, said cover having a front face at the closed end thereof, said front face including an optically transparent portion for allowing transmission of said light radiations therethrough, said cover carrying said multifunction register for measuring parameters of electrical energy usage in response to said signals, said front face further including a plurality of integral index means aligned with said optical data link tube, said plurality of integral index means for engaging said plurality of fingers to orient said programmer/reader unit with said optical data link tube;
    whereby accurate data transfer between said optical data link tube and said programmer/reader unit via said optically transparent portion of said front fact is facilitated.

2. The electrical energy meter of claim 1 including a plurality of bolts, further including a plurality of cylindrical hollow spacer posts concentrically fitted onto said bolts such that said bolts and said posts attach the multifunction register to the cover.

3. The electrical energy meter of claim 1 wherein the means for providing signals representative of electrical energy usage includes an electromechanical pulse initiator generating pulses at a rate proportional to electrical energy usage.

4. The electrical energy meter of claim 1 wherein the means for providing signals representative of electrical energy usage includes a cam driven mechanical pulse initiator generating pulses at a rate proportional to electrical energy usage.

5. An electrical energy meter having a covermounted time-based multifunction register for measuring parameters of electrical energy usage and for interactively communicating by way of light radiations with a programmer/reader unit having a plurality of fingers at the front thereof, said electrical energy meter comprising:
    a meter base;
    means for providing signals representative of electrical energy usage, said means carried by said meter base;
    a cup-shaped cover engaging said meter base at an open end of said cover, said cover having a front face at the closed end thereof, said front face including an optically transparent portion for allowing transmission of said light radiations therethrough, said cover carrying said multifunction register for measuring parameters of electrical energy usage in response to said signals, said front face further including a plurality of integral index means for engaging said plurality of fingers to orient said programmer/reader unit with respect to said multifunction register,
    means compartmentalizing said electrical energy meter such that the multifunction register is shielded from heat generated by the means for providing signals representative of electrical energy usage;
    whereby accurate data transfer between said multifunction register and said programmer/reader unit via said optically transparent portion of said front face is facilitated.

6. The electrical energy meter of claim 5 wherein the means compartmentalizing said electrical energy meter includes a circular grommet having a groove therein and attached to the interior circumference of the cover, said means further including a circular baffle plate positioned within said groove.

* * * * *